SEMICONDUCTOR FABRICATION TECHNIQUE PERMITTING EXAMINATION OF EPITAXIALLY GROWN LAYERS

Filed Feb. 2, 1967

WITNESSES:
Bernard R. Giegucy
James F. Young

INVENTORS
Glenn W. Skouson and
Marvin H. White.
BY
Gordon H. Telfer
ATTORNEY 3,473,977

SEMICONDUCTOR FABRICATION TECHNIQUE PERMITTING EXAMINATION OF EPITAXIALLY GROWN LAYERS

Glenn W. Skouson, Severna Park, Md., and Marvin H. White, Columbus, Ohio, assignors to Westinghouse Electric Corporation, Pittsburgh, Pa., a corporation of Pennsylvania Filed Feb. 2, 1967, Ser. No. 613,618
Int. Cl. H01l 7/32, 5/00; G01n 33/20
U.S. Cl. 148—175 4 Claims

ABSTRACT OF THE DISCLOSURE

A method for permitting examination and monitoring of epitaxially grown layers of semiconductive material where adjacent layers of a completed structure are to be of the same conductivity type by interposing a layer of opposite conductivity type and subsequently converting it by diffusion; and an article of manufacture formed for that purpose.

The invention described herein was made in the performance of work under a NASA contract and is subject to the provisions of Section 305 of the National Aeronautics and Space Act of 1958, Public Law 85–568 (72 Stat. 435; 42 U.S.C. 2457).

BACKGROUND OF THE INVENTION

Field of the invention

This invention relates to semiconductor device fabrication, particularly fabrication of complex semiconductor structures such as integrated circuits that may require adjacent layers of material of the same conductivity type and different resistivity. The invention also relates to articles of manufacture intermediate to the formation of such complex semiconductor structures.

Description of the prior art

It is known to form certain semiconductor structures with adjacent layers of material of the same conductivity type and different resistivity. Some semiconductor integrated circuit structures, for example, comprise a substrate of a first conductivity type on which first and second successive layers of a second conductivity type are disposed, the second layer having a greater resistivity than the first. Subsequent processing operations produces functional elements in the second layer with the first layer helping to provide low saturation resistance transistors. See, for example, Lin Patent 3,236,701, Feb. 22, 1966 for further description of such integrated circuits.

In making such structures by the prior art it has been difficult to examine and hence control the thickness and resistivity of the second layer because known measuring techniques rely upon differentiation by means of a p-n junction between the layer being examined and the remaining structure. In integrated circuit fabrication the thickness and resistivity of the second referred to layer can be very important to the ultimate performance of the completed integrated circuit. The same problems may be encountered in any instance of forming an epitaxial layer without a change of conductivity type and hence not merely with the above-mentioned type of integrated circuits.

A known technique for avoiding the above-mentioned problems is to place in the reaction chamber just prior to the growth of the layer that it is desired to examine another substrate with a surface of opposite conductivity type to that of the material to be grown so that straightforward examination procedures may be performed on it. Unfortunately in producing structures involving successive epitaxial growth operations it is undesirable for the reactor to be open between operations and permit contaminants from the surrounding air to enter because of contamination of the surface of the existing structure. To avoid adverse effects, etching of the surface and flushing of the system would be necessary, as is usual in starting an epitaxial growth operation. Such additional processing adds further cost to fabrication.

SUMMARY

The invention avoids the above-mentioned problems and is otherwise advantageous while still permitting use of known measurement techniques that rely on p-n junction differentiation. The invention is also thoroughly compatible with existing integrated circuit fabrication techniques.

Prior to the formation of the layer that it is desired to monitor there is formed an intermediate layer of opposite conductivity type. The layer in question is formed on the intermediate layer and is examined. After examination of the layer to determine that its thickness and resistivity are correct the structure is heated to cause impurities from the layers adjoining the intermediate layer to diffuse into and convert the intermediate layer throughout its entire thickness to the same conductivity type.

The invention is particularly advantageous where it is desired to form a structure having the first and second layers in successive reactions in a chamber without opening it to a contaminating atmosphere. However the invention may also be used in monitoring an epitaxial layer on any substrate of the same conductivity type even if such substrate is not epitaxially grown.

Part or all of the heating required to convert the intermediate layer may be provided in the subsequent diffusion operations to which the structure is subjected such as to form the functional elements of an integrated circuit in the last formed epitaxial layer.

For ease in conversion of the intermediate layer it is desirable that it be of high resistivity and be thin and particularly that it be of greater resistivity and less thickness than either of said layers of adjoining material. Since the thickness and resistivity of the intermediate layer are not critical, it may be formed relatively easily without careful control or monitoring. In general it is convenient that the intermediate layer have a thickness less than about 5 microns and have a resistivity greater than the resistivity of each of the adjoining layers by at least about an order of magnitude.

DESCRIPTION OF THE PREFERRED EMBODIMENTS

Figure 1:
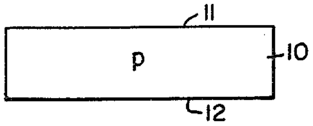
FIGS. 1 through 6 are sectional views of a semiconductor structure at successive stages in the course of fabrication process of a double-epitaxial type of integrated circuit employing the technique of this invention.

The invention will be described as applied in the fabrication of semiconductor integrated circuits of the double epitaxial layer type although in its broader aspects the invention is not so limited. The invention may be practiced with the use of commercially available and well-known semi-conductive materials, doping agents, reactants for epitaxial growth, reaction apparatus, apparatus for the measurement of epitaxial layer thickness and resistivity.

The figures of the drawing are not to scale. Vertical dimensions have been more greatly exaggerated than horizontal dimensions for clarity. The conductivity type of the various regions may be reversed from those shown.

FIG. 1 shows a starting body 10 of p-type conductivity, for example silicon that is monocrystalline and of the quality used for substrates in present integrated circuit fabrication. The body 10 has substantially flat and parallel major surfaces of suitable crystallographic orientation as is known to permit efficient epitaxial growth of additional silicon thereon. Dimensions and resistivity of the body 10 may also be as are usual for integrated circuit starting bodies.

A surface 11 of the starting body is prepared for epitaxial growth by a known cleaning technique such as applying anhydrous hydrogen chloride vapor at a high temperature such as about 1200° C. for about 10 minutes. The etchant may, for example, comprise 2% hydrogen chloride in hydrogen, although the concentration may vary widely.

Figure 2:
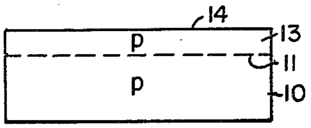

Commercially available starting materials tend to have some horizontal variation in resistivity that is undesirable because corresponding variations tend to be produced in additional layers formed thereon. In some cases, as shown in FIG. 2, it is preferred to form on a surface 11 of the starting substrate 10 a thin layer 13 of the same conductivity type by epitaxial growth that ensures greater uniformity of the exposed surface. This epitaxial growth operation may be performed, as may the subsequently referred to epitaxial growth operations, by known reactions such as the thermal decomposition of silicon tetrachloride with hydrogen, or decomposition of any other silicon compound used for epitaxial deposition, with a gaseous doping agent, such as diborane for p-type material and arsene or phosphene for n-type material, provided in the reaction chamber in an amount predetermined to provide the required resistivity and permitting the reaction to occur for a time predetermined to provide the required thickness. Reference may be made to copending application Ser. No. 552,610, filed May 24, 1966, by McLouski and Halsor, assigned to the assignee of the present application, for further description of a suitable epitaxial growth system.

The resistivity of the p-type epitaxial layer 13 need not differ from the average resistivity of the substrate and may be, for example, at a moderately high value within the range of from about 5 ohm-centimeters to about 10 ohm-centimeters. Layer 13 may be quite thin such as only about 3 to 5 microns thick.

Figure 3:
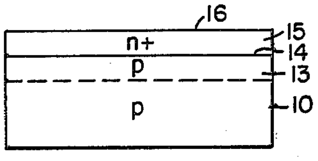

Upon the exposed surface 14 of the p type epitaxial layer 13 is formed a highly doped layer 15 of n-type conductivity as illustrated in FIG. 3. This layer may be as has been previously formed in the fabrication of double epitaxial layer integrated circuits. Due to its relatively high doping level, layer 15 may be designated n+.

Figure 4:
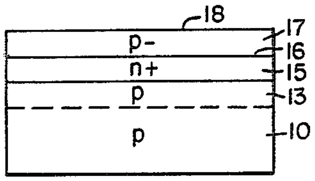

In the prior art there would next be formed a lower doped n-type layer but the present invention departs from that practice by forming on the surface 16 of layer 15, as shown in FIG. 4, a thin layer 17 of p-type conductivity with relatively low doping (high resistivity). Due to its relatively low doping level, layer 17 may be designated as p− (p minus). For convenience, the structure illustrated in FIG. 2 will sometimes be referred to as the substrate, the n+ layer as the first layer and the p− layer as the intermediate layer.

Figure 5:
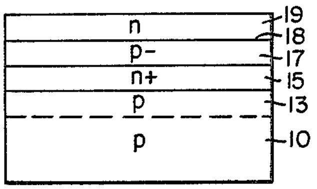

FIG. 5 illustrates a final layer 19 of n type conductivity on the surface 18 of the intermediate layer 17. It is of lower doping and hence higher resistivity (e.g. at least about an order of magnitude higher), than the first layer 15. Layer 19 will sometimes be referred to as the second layer.

The structure illustrated in FIG. 5 is a novel article of manufacture. In prior known semiconductor device processing it would be undesirable to provide an epitaxial layer of one type between two adjacent layers wherein the intermediate layer is thin and of low doping relative to the adjacent layers because in subsequent processing, such as diffusion, operations in which the structure is subjected to heat the intermediate layer would be obliterated by the diffusion of impurities from the adjoining layers. However this fact is put to advantageous use in accordance with this invention. The structure of FIG. 5 results from the completion of the epitaxial growth operations necessary for integrated circuit fabrication. A sampling of a plurality of such structures formed simultaneously in a single reactor may be examined in order to determine the characteristics of the second layer 19. For example, the resistivity of that layer may be measured by the 4-point probe technique. The thickness of the layer may be measured by infrared interferometry. Also the structure may be sectioned and stained. These techniques all rely on differentiation of the layer being examined from the remaining material by means of a p-n junction which is provided by that between the second layer 19 and the intermediate layer 17.

When the foregoing examination and measuring operations are complete the structure is subjected to heating to convert the intermediate layer 17 to n-type conductivity. As mentioned it is convenient to make that layer thin and of high resistivity compared with the adjoining material.

Figure 6:
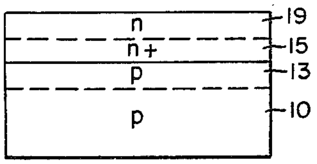

Merely by way of further example, structures have been made wherein the first layer 15 had a thickness, as determined by counting interference fringes as with the other thickness measurements mentioned, of microns three to five (varying for different runs) and a resistivity (4-point probe measurements) within the range from about 0.001 ohm centimeter to about 0.01 ohm centimeter. The intermediate layer 17 typically had a thickness of 3.55 microns (may range from three to five microns) and a resistivity within the range of from about 15 ohm centimeters to about 50 ohm centimeters. The second layer 19 had a thickness of 10 to 12 microns (varying for different runs) and a resistivity of from about 1 ohm centimeter to about 2 ohm centimeters. All of the epitaxially grown layers were formed in one continuous operation. Four point probe measurements were taken and junction depth measurements were made. The structure was then subjected to a 6½ hour heating at a temperature of about 1200° C. after which junction depth measurements were made and the cross-section of the surface was stained showing complete conversion of the intermediate layer 17 to n-type material, the only junction being that between layer 15 and the substrate, as shown in FIG. 6. That junction may move as a result of heating but the relatively thick substrate is retained.

The heating for the conversion of the intermediate layer need not be performed separately as suggested by the illustration of FIG. 6 but may be effected during the diffusion of impurities into the second epitaxial n-type layer 19 for the formation of isolation walls and the regions of functional elements of the integrated circuit. Such diffusion operations require heating cycles of much greater length than that required for the conversion of the intermediate layer so that other than the formation of the intermediate layer itself the present invention requires no modification of previous integrated circuit fabrication.

Figure 7:
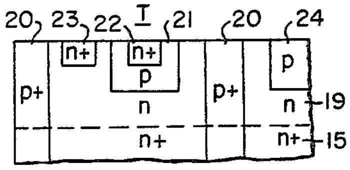
FIG. 7 is a partial, enlarged sectional view of the structure at a subsequent stage.

FIG. 7 illustrates diffused isolation walls 20 extending through both the first and second epitaxial layers 15 and 19 providing isolated regions of n-type material. The isolation walls 20 will extend to the substrate. Within one isolated portion is formed, for example, a transistor structure T including a p-type base region 21 and an n+ emitter region 22 formed by successive, selective diffusion operations utilizing, for example, oxide masking and photolithographic techniques. An n+ region 23 may also be formed for facilitating subsequent formation of an ohmic contact to the underlying n-type material of layer 19 that provides the transistor collector region. During the base diffusion a p-type region 24 may also be diffused in another isolated portion in order to provide a region performing the function of a resistance in the ultimate integrated circuit. The structure of FIG. 7 is merely exemplary. Other known integrated circuit device element fabrication techniques may be employed and are not affected by utilization of the present invention except that layer 19 may be more readily provided with particular properties.

While the invention has been shown and described in certain forms only it will be apparent that various changes may be made while retaining its essential features.

We claim as our invention:

1. In the fabrication of semiconductor structures which are to have two adjacent layers of semiconductive material of the same conductivity type but with different resistivity wherein the second of the two layers to be formed is formed by epitaxial growth on a structure that includes the first layer, a method for permitting examination of said second layer such as for resistivity and thickness measurement comprising: epitaxially growing on said first layer, before said second layer is grown, an intermediate layer of opposite conductivity type with a first p-n junction occurring between said first and intermediate layers; epitaxially growing said second layer on said intermediate layer with a second p-n junction occurring between said second and intermediate layers; measuring the thickness and resistivity of said second layer wherein it is distinguishable from the remaining structure by reason of said second p-n junction with said intermediate layer; and heating to cause impurities from said first and second layers to diffuse into and convert said intermediate layer through its entire thickness to the same conductivity type as said first and second layers.

2. The subject matter of claim 1 wherein: said first, intermediate, and second layers are successively epitaxially grown in a reaction chamber without exposure of the structure to a contaminating atmosphere between growth of adjacent layers.

3. The subject matter of claim 1 wherein: said first layer is formed by epitaxial growth on a substrate of opposite conductivity type and subsequent selective impurity diffusion operations are performed in said second layer.

4. The subject matter of claim 1 wherein: said intermediate layer is of greater resistivity and less thickness than either of said first and second layers.

References Cited

UNITED STATES PATENTS

| | | | |
|---|---|---|---|
| 3,099,579 | 7/1963 | Spitzer et al. ---- | 148—175 XR |
| 3,189,494 | 6/1965 | Short ---------- | 148—174 XR |

L. DEWAYNE RUTLEDGE, Primary Examiner

P. WEINSTEIN, Assistant Examiner

U.S. Cl. X.R.

29—574; 117—106, 107.2; 148—1.5, 186